(12) United States Patent
Rajski et al.

(10) Patent No.: US 6,539,409 B2
(45) Date of Patent: Mar. 25, 2003

(54) METHOD FOR SYNTHESIZING LINEAR FINITE STATE MACHINES

(76) Inventors: Janusz Rajski, 6502 Horton Rd., West Linn, OR (US) 97068; Mark Kassab, 29665 SW. Rose La., Apt. 288, Wilsonville, OR (US) 97070; Nilanjan Mukherjee, 29290 SW. Parkway Ct., Apartment 92, Wilsonville, OR (US) 97070; Jerzy Tyszer, Os. Stare Zegrze 89C/2, 61-249 Poznan (PL)

( * ) Notice: Subject to any disclaimer, the term of this patent is extended or adjusted under 35 U.S.C. 154(b) by 0 days.

(21) Appl. No.: 09/957,701

(22) Filed: Sep. 18, 2001

(65) Prior Publication Data

US 2002/0016806 A1 Feb. 7, 2002

Related U.S. Application Data

(63) Continuation of application No. 09/620,023, filed on Jul. 20, 2000, now Pat. No. 6,353,842.
(60) Provisional application No. 60/167,445, filed on Nov. 23, 1999.

(51) Int. Cl.[7] ............................................. G06F 1/02
(52) U.S. Cl. ..................................................... 708/252
(58) Field of Search .................................. 708/252, 250

(56) References Cited

U.S. PATENT DOCUMENTS

| | | | |
|---|---|---|---|
| 3,614,400 A | 10/1971 | Farnett ........................ 708/252 |
| 3,700,869 A | 10/1972 | Low et al. ................... 708/252 |
| 4,503,537 A | 3/1985 | McAnney ..................... 371/25 |
| 4,513,418 A | 4/1985 | Bardell, Jr. et al. ........... 371/25 |
| 4,602,210 A | 7/1986 | Fasang et al. .............. 324/73 R |
| 4,687,988 A | 8/1987 | Eichelberger et al. ........ 324/73 |
| 4,754,215 A | 6/1988 | Kawai ........................ 324/73 R |
| 4,785,410 A | 11/1988 | Hamatsu et al. ............. 364/717 |
| 4,801,870 A | 1/1989 | Eichelberger et al. ..... 324/73 R |

(List continued on next page.)

OTHER PUBLICATIONS

Bershteyn, Michael, "Calculation of Multiple Sets of Weights for Weighted Random Testing," International Test Conference 1993, Paper 45.3, pp. 1031–1040.
Zacharia, N., "Decompression of Test Data Using Variable–Length Seed LFSRs," IEEE 1995, 426–432.
P.H. Bardell, "Design Considerations for Parallel Pseudorandom Pattern Generators", Journal of Electronic Testing: Theory and Applications, 1,73–87 (1990).
I. Hamzaoglu, J. Patel, "Reducing Test Application Time for Full Scan Embedded Cores," Center for Reliable & High–Performance Computing, University of Illinois, Urbana, IL., 1999 IEEE.

(List continued on next page.)

*Primary Examiner*—David H. Malzahn
(74) *Attorney, Agent, or Firm*—Klarquist Sparkman LLP

(57) ABSTRACT

Method and apparatus for synthesizing high-performance linear finite state machines (LFSMs) such as linear feedback shift registers (LFSRs) or cellular automata (CA). Given a characteristic polynomial for the circuit, the method obtains an original LFSM circuit such as a type I or type II LFSR. Feedback connections within the original circuit are then determined. Subsequently, a number of transformations that shift the feedback connections can be applied in such a way that properties of the original circuit are preserved in a modified LFSM circuit. In particular, if the original circuit is represented by a primitive characteristic polynomial, the method preserves the maximum-length property of the original circuit in the modified circuit and enables the modified circuit to produce the same m-sequence as the original circuit. Through the various transformations, a modified LFSM circuit can be created that provides higher performance through shorter feedback connection lines, fewer levels of logic, and lower internal fan-out.

18 Claims, 10 Drawing Sheets

U.S. PATENT DOCUMENTS

| | | | |
|---|---|---|---|
| 4,860,236 A | 8/1989 | McLeod et al. | 364/717 |
| 4,959,832 A | 9/1990 | Bardell, Jr. | 371/27 |
| 4,974,184 A | 11/1990 | Avra | 364/717 |
| 5,090,035 A | 2/1992 | Murase | 377/72 |
| 5,138,619 A | 8/1992 | Fasang et al. | 371/21.1 |
| 5,173,906 A | 12/1992 | Dreibelbis et al. | 371/22.5 |
| 5,268,949 A | 12/1993 | Watanabe | 377/33 |
| 5,301,199 A | 4/1994 | Ikenaga et al. | 371/22.5 |
| 5,325,367 A | 6/1994 | Dekker et al. | 371/21.1 |
| 5,369,648 A | 11/1994 | Nelson | 371/27 |
| 5,394,405 A | 2/1995 | Savir | 371/27 |
| 5,412,665 A | 5/1995 | Gruodis et al. | 371/27 |
| 5,414,716 A | 5/1995 | Bershteyn | 371/27 |
| 5,446,683 A | 8/1995 | Mullen et al. | 364/717 |
| 5,450,414 A | 9/1995 | Lin | 371/223 |
| 5,574,733 A | 11/1996 | Kim | 371/27 |
| 5,586,125 A | 12/1996 | Warner | 371/27 |
| 5,592,493 A | 1/1997 | Crouch et al. | 371/22.3 |
| 5,612,963 A | 3/1997 | Koenemann et al. | 371/27 |
| 5,631,913 A | 5/1997 | Maeda | 371/22.4 |
| 5,694,402 A | 12/1997 | Butler et al. | 371/22.5 |
| 5,719,913 A | 2/1998 | Maeno | 377/54 |
| 5,748,497 A | 5/1998 | Scott et al. | 364/551.04 |
| 5,790,562 A | 8/1998 | Murray et al. | 371/22.4 |
| 5,790,626 A | 8/1998 | Johnson et al. | 377/69 |
| 5,831,992 A | 11/1998 | Wu | 371/22.4 |
| 5,899,961 A | 5/1999 | Sundermann | 703/117 |
| 5,974,433 A | 10/1999 | Currie | 708/252 |
| 5,991,898 A | 11/1999 | Rajski et al. | 714/30 |
| 5,991,909 A | 11/1999 | Rajski et al. | 714/729 |
| 6,006,349 A | 12/1999 | Fujisaki | 714/738 |
| 6,072,823 A | 6/2000 | Takakusaki | 708/252 |
| 6,141,669 A | 10/2000 | Carleton | 708/252 |
| 6,158,032 A | 12/2000 | Currier et al. | 714/726 |

OTHER PUBLICATIONS

S. Hellebrand, J. Rajski, S. Tarnick, S. Venkataraman, B. Courtois, "Built–in Test for Circuits With Scan Based on Reseeding of Multiple Polynomial Linear Feedback Shift Registers", *IEEE Trans. On Computers*, vol. C–44, pp. 223–233, 1995.

S. Hellebrand, B. Reeb, S. Tarnick, H–J Wunderlich, "Pattern Generation for a Deterministic BIST Scheme", pp. 88–941995 IEEE.

B. Koenemann c/o IBM Corp. , B56/901, "LFSR–Coded Test Patterns for Scan Designs", *Proceedings of European Test Conference*, pp. 237–242, 1991.

J. Rajski,J. Tyszer, N. Zacharia, "Decompression of Test Data Using Variable–Length Seed LFSRs", Microelectronics and Computer Systems Laboratory, McGill University, Montreal, Canada, 1995 IEEE, pp. 426–433.

J. Rajski, J. Tyszer, N. Zacharia, "Test Data Decompression for Multiple Scan Designs with Boundary Scan," IEEE Transactions on Computers, vol. 47, No. 11, Nov. 1998, pp. 1188–1200.

J. Rajski and J. Tyszer, "Design of Phase Shifters for BIST Applications", *Proc. VLSI Test Symposium*, pp. 218–224, 1998.

J. Rajski, N. Tamarapalli, J. Tyszer, "Automated Synthesis of Large Phase Shifters for Built–In Self–Test," International Test Conference, Paper 41.1, pp. 1047–1056, IEEE 1998.

Venkataraman, Rajski, Hellebrand, and Tarnick, "An Efficient BIST Scheme Based on Reseeding of Multiple Polynomial Linear Feedback Shift Registers", pp. 572–577, 1993 IEEE.

P.H. Bardell, W.H. McAnney, J. Savir, Built in test for VLSI: Pseudorandom Techniques, John Wiley & Sons, 1987, pp. 61–88.

W–B, Jone and S.R. Das, "Space compression method for built–in self testing of VLSI circuits," *Int. Journal of Computer Aided VLSI Design*, vol. 3, pp. 309–322, 1991.

H.J. Wunderlich, "On computing optimized input probabilities for random tests," Proc. DAC pp. 392–398, 1987.

N.R. Saxena and J.P. Robinson, "Accumulator compression testing," *IEEE Trans. Comput.*, vol. C–35, No. 4, pp. 317–321, 1986.

J.P. Hayes, "Check sum test methods," *Proc. FTCS*, pp. 114–120, 1976.

J. Savir, "Syndrome–testable design of combinational circuits," *IEEE Trans. Comput.* vol. C–29, No. 6, pp. 442–451, 1980.

Y.K. Li and J.P. Robinson, "Space compression methods with output data modification," *IEEE Trans. CAD if Integrated Circuits and Systems*, vol. CAD–6, No. 2, pp. 290–294, 1987.

J.E. Smith, "Measures of the effectiveness of fault signature analysis," *IEEE Trans. Comput.*, vol. C–29, No. 6, pp. 510–514, 1980.

K.J. Latawiec, "New method of generation of shifted linear pseudorandom binary sequences", *Proc. IEE*, vol. 121, No. 8, pp. 905–906, 1974.

N.R. Saxena and E.J. McCluskey, "Extended precision checksums," *Proc. FTCS*, pp. 142–147, 1987.

J.P. Hayes, "Transition count testing of combinational logic circuits," *IEEE Trans. Comput.*, vol. C–25, No. 6, pp. 613–620, 1976.

P.H. Bardell and W.H. McAnney, "Pseudorandom arrays for built–in tests," ISSS Trans. Comput., vol. C–35, No. 7, pp. 653–658, 1986.

B. Ireland and J.E. Marshall, "Matrix method to determine shaft–register connections for delayed pseudorandom binary sequences," *Electronics Letters*, vol. 4, No. 15, pp. 309–310, 1968.

J.A. Waicukauski, E. Lindbloom, E.B. Eichelberger, O.P. Forlenza, "A method for generating weighted random test patterns," *IBM J. Res. Develop.*, vol. 33, No. 2, pp. 149–161, Mar. 1989.

R.A. Frowerk, "Signature analysis: a new digital field services method," *Hewlett–Packard Journal*, pp. 2–8, May 1997.

G. Hetherington, T. Fryars, N. Tamarapalli, M. Kassab, A. Hasson and J. Rajski, "Logic BIST for Large Industrial Designs: Real Issues and Case Studies," *Proc. ITC*, pp. 358–367, 1999.

V. Iyengar, K. Chakrabarty, and B.T. Murray, "Built–In Slf–testing of sequential circuits using precomputed test sets," *Proc. VLSI Test Symposium*, pp. 418–423, 1998.

A. JAS, J. Ghosh–Dastidar, and N.A. Touba, "Scan vector compression/decompression using statistical coding," Proc. VLSI Test Symposium, pp. 114–120, 1999.

A.Jas,and N.A. Touba, "Test vector decompression via cyclical scan chains and its application to testing core–based designs," Proc. ITC, pp. 458–464, 1998.

H.J. Wunderlich, "Multiple distribution for biased random test patterns," *Proc. ITC*, pp. 236–244, 1988.

T. Yamaguchi, M. Tilgner, M. Ishida, D.S. Ha, "An efficient method for compressing test data," Proc. ITC, pp. 191–199, 1997.

K. Chakrabarty, B.T. Murray, and J.P. Hayes. "Optimal space compaction of test responses," *Proc. ITC*, pp. 834–843, 1995.

K, Chakrabarty and J.P. Hayes, "Test response compaction using multiplexed parity trees." *IEEE Transactions CAD of Integrated Circuits and Systems*, vol. CAD–15, No. 11, pp. 1399–1408, 1996.

A. Ivanov, B. Tsuji, and Y. Zorian, "Programmable BIST sapce compactors," *IEEE Trans. Comput.*, vol. C–45, No. 12, pp. 1393–1404, 1996.

B. Pouya and N.A. Touba, "Synthesis of zero–aliasing elementary–tree space compactors," Proc. VLSI Test Symp., pp. 70–77, 1998.

S.M. Reddy, K. Saluja, M. Karpovski, "A Data compression technique for built–in self–test," IEEE Trans. Comput., vol. C–37, pp. 1151–1156, 1988.

M. Serra, T. Slater, J.C. Muzio, and D.M. Miller, "The analysis of one–dimensional linear cellular automata and their aliasing properties," *IEEE Trans. CAD of Integrated Circuits and Systems*, vol. CAD–9, No. 7, pp. 767–778, 1990.

T.W. Williams, W. Daehn, M. Gruetzner, and C.W. Starke, "Bounds and analysis of aliasing errors in linear–feedback shift registers," *IEEE Trans. CAD of Integarted Circuits and Systems*, vol. CAD–7, No. 1, pp. 75–83, 1988.

M. Ishida, D.S. Ha, T. Yamaguchi, "Compact: A hybrid method for compression test data," *Proc. VLSI Test Symposium*, pp. 62–69, 1998.

K. Kim, D.S. Ha, J.G. Tront, "On using signature registers as pseudorandon pattern generators in built–in self testing," *IEEE Trans. CAD of IC*, vol. CAD–7, No. 8, 1988, pp. 919–928.

G. Mrugalski, J. Rajski, J. Tyszer, "Synthesis of pattern generators based on cellular automata with phase shifters," Proc. Int. Test Conf., pp. 368–377, 1999.

R. Kapur, S. Patil, T.J. Snethen, and T.W. Williams, "Design of an efficient weighted random pattern generation system" *Proc. ITC.*, pp. 491–500, 1994.

F. Muradali, V.K. Agarwal, and B. Nadeau–Dostie, "A new procedure for weighted random built–in self–test," *Proc. ITC.*, pp. 600–669, 1990.

S. Pateras and J. Rajski "Cube contained random patterns and their application to the complete testing of synthesized multi–level circuits," *Proc. ITC.*, pp. 473–482, 1991.

J. Rajski, J. Tyszer, "Test responses compaction in accumulators with rotate carry adders," *IEEE Transactions CAD of Integrated Circuits and Systems*, vol. CAD–12, No. 4, pp. 531–539, 1993.

J. Rajski, J. Tyszer, "Accumulator–based compaction of test responses," *IEEE Transactions on Comput.*, vol. C–42, No. 6, pp. 643–650, 1993.

N.R. Saxena and E.J. McCluskey, "Analysis of checksums, extended–precision checksums, and cyclic redundancy," *IEEE Trans. Comput.*, vol. C–39, No. 7, pp. 969–975, 1990.

N.A. Touba and E.J. McCluskey, "Transformed pseudo–random patterns for BIST," *Proc. VLSI Test Symposium*, pp. 410–416, 1995.

N.A. Touba and E.J. McCluskey, "Altering a pseudo–random bit sequence for scan–based BIST," Proc. ITC., pp. 167–175, 1996.

K.H. Tsai, S. Hellebrand, J. Rajski, and Marek–Sadowska, "STARBIST: Scan autocorrelated random pattern generation," Proc. DAC, pp. 472–477, 1997.

H.J. Wunderlich and G. Kiefer, "Bit–flipping BIST," Proc. ICCAD, pp. 337–343, 1996.

S.W. Golomb, Shift Register Sequences, Holden Day, San Francisco, 1967. pp. 17–24 and 75–89.

V.N. Yarmolik and S.N. Demidenko, Generation and Application of Pseudorandom Sequences for Random Testing, J. Wiley & Sons, New York, 1988. pp. 63–94.

U.S. patent application Ser. No. 09/713,662, Rajski et al., filed Jul. 20, 2000.

U.S. patent application Ser. No. 09/713,664, Rajski et al., filed Nov. 15, 2000.

U.S. patent application Ser. No. 09/619,988, Rajski et al., filed Jul. 20, 2000.

U.S. patent application Ser. No. 09/620,021, Rajski et al., filed Jul. 20, 2000.

U.S. patent application Ser. No. 09/619,985, Rajski et al., filed Jul. 20, 2000.

TYPE I LFSR

TYPE II LFSR

METHOD FOR SYNTHESIZING LINEAR FINITE STATE MACHINES

RELATED APPLICATION DATA

This application is a continuation of application Ser. No. 09/620,023, filed Jul. 20, 2000, now U.S. Pat. No. 6,353,842 B1 and claims priority to Provisional Application No. 60/167,445, filed Nov. 23, 1999.

BACKGROUND OF INVENTION

Linear finite state machines (LFSMs) such as linear feedback shift registers (LFSRS) and cellular automata (CA) are often used for generating pseudo-random sequences. Such devices are well known in the art and are amply described in a number of references such as V. N. Yarmolik and S. N. Demidenko, *Generation and Application of Pseudorandom Sequences for Random Testing*, J. Wiley and Sons, New York, 1988. An LFSR includes memory elements such as flip-flops and linear logic gates such as XOR or XNOR gates connected as shown in FIG. 1. An LFSR of length n can be represented mathematically by its characteristic polynomial $h_n x^n + h_{n-1} x^{n-1} + \ldots + h_0$, where the term $h_i x^i$ refers to the ith flip-flop of the register, such that, if $h_i=1$, then there is a feedback tap taken from this flip-flop. Also, $h_0=1$. When the proper tap connections are established in accordance with the given polynomial, the combined (added modulo 2) output of each stage is fed back to the first stage of the LFSR. Such an implementation is called a type I LFSR or Fibonacci generator. To initiate the operation of the LFSR, a nonzero n-bit vector (frequently called a seed) is loaded into the register, and a clock is pulsed at the appropriate rate. An LFSR initialized as described above can cycle through a number of states before coming back to the initial state. If an n-bit LFSR can cycle through all possible $2^n-1$ nonzero states, then its characteristic polynomial is called a primitive characteristic polynomial. Such an LFSR is often referred to as a maximum-length LFSR, and the resultant output sequence is termed a maximum-length sequence or m-sequence. M-sequences have a number of unique properties, as described in P. H. Bardell, W. H. McAnney, and J. Savir, *Built-In Test for VLSI: Pseudorandom Techniques*, John Wiley & Sons, 1987.

An alternative LFSR implementation is shown in FIG. 2. It is called a type II LFSR or Galois true divisor. A distinct feature of this implementation is that the output of the last stage of the LFSR is fed back to prior stages as indicated by the characteristic polynomial employed. As with a type I LFSR, a type II LFSR constructed in accordance with a primitive characteristic polynomial and loaded with a non-zero n-bit vector will produce all $2^n-1$ nonzero states.

When the output is taken from the last stage of a type I or type II LFSR constructed in accordance with the same primitive characteristic polynomial, then the resulting m-sequences are different. The same m-sequences can be obtained, however, if a given primitive characteristic polynomial and its reciprocal are use to implement the type I and type II LFSRs, respectively, and both registers are properly initialized.

LFSMs such as the LFSRs described above are employed in a vast variety of applications, including error detection and correction, data transmission, mobile telephony, cryptography, testing of very large scale integrated circuits, data compression, and hardware white noise generation. For high-performance applications, the required data generation and compression can only be achieved by high-performance circuits. The highest operating speeds of conventional LFSR-based generators, encoders, decoders or compactors are limited by the performance of their respective elements. For a type I LFSR, performance is limited by the depth (i.e., number of levels) of the combinational logic in its feedback path. For a type II LFSR, performance is limited by buffers in the feedback path needed to compensate for internal fan-out on the output of the last stage. In addition, the buffers slow the circuit's operation. In both types of LFSRs, the limitations are especially pronounced for LFSRs having a characteristic polynomial with a large number of terms.

Attempts have been made to improve the performance of conventional LFSRs. Several are described in P. H. Bardell, "Design Considerations for Parallel Pseudorandom Pattern Generators," *Journal of Electronic Testing: Theory and Applications*, No. 1, pp. 73–87, 1990. Others are described in various U.S. patents. For example, a linear pseudo-random test pattern generator that is aimed at generating all $2^n$ vectors using an LFSR enhanced by means of external circuitry is disclosed in the U.S. Pat. No. 4,974,184. The scheme employs a switching circuit added to the feedback network of the register to produce and insert into a suitable position the so-called "stuck-state" which cannot be obtained by means of the conventional linear finite state machines. Typically, the stuck-state consists of an all-0s pattern that can be conveniently employed in several testing approaches (e.g., a memory test).

U.S. Pat. No. 5,268,949 describes a pseudo-random test pattern generator having a higher operating speed than the conventional LFSRs. The speed of any LFSR is determined by the performance of the respective elements comprising the generator. In particular, an XOR feedback network may introduce significant delays if an LFSR features a large number of feedback taps. The patent proposes the use of a number of LFSRs connected in parallel fashion and operated at lower clock speed, wherein the actual output signals are produced on the multiplex basis. However, this architecture has much larger area overhead than typical LFSRs and its performance is still limited by multiplexers in the output function.

U.S. Pat. No. 5,412,665 describes another parallel-operation high-speed test pattern generation and test response compaction implemented by means of low-speed components. It utilizes a number of flip-flops and connected combinational logic networks. Each network provides a pseudo-random pattern which is output in parallel, thereby creating a high-speed data flow with an increased area of the circuitry.

U.S. Pat. No. 5,466,683 describes a programmable LFSR that produces pseudo-random patterns having a variable characteristic polynomial. Its sequence generator is driven by applying appropriate control signals in such a way that a given control signal has a value of 1 if the corresponding term of the characteristic polynomial has a coefficient of 1. Consequently, the proposed scheme places an XOR gate and associated two-way multiplexer in the front of each LFSR stage, thus incurring significant area overhead. A similar architecture of a programmable LFSR with a provision for an initialization circuitry is given in U.S. Pat. No. 5,090,035.

U.S. Pat. No. 5,790,626 describes a bi-directional LFSR employing latches having dual (forward and reverse) inputs. This LFSR can generate both state trajectories: the forward sequence of patterns, and the reverse one corresponding to an original feedback polynomial and its reciprocal counterpart, respectively. The register features two different linear feedback networks that operate exclusively at a time, but can intermix forward and reverse steps, thus allowing the vector generation process to follow the native sequence of the LFSR in both directions at any time. A similar concept is also disclosed in the U.S. Pat. No. 5,719,913, where the XOR gates in the feedback network are driven by multiplicity of two-way multiplexers.

None of these prior attempts, however, provides an optimal solution to the performance limitations noted above and found in presents LFSMs.

SUMMARY

In one aspect of the invention, a method for synthesizing a linear feedback shift register (LFSR) includes the following steps. An original linear finite state machine circuit is obtained, the circuit including a plurality of memory elements and linear logic gates and capable of generating an output sequence. Feedback connections in the original circuit are determined, a feedback connection spanning a number of memory elements and including a source tap and destination tap connected by an associated feedback connection line. The source and destination taps of one or more of the feedback connection are then shifted across a number of memory elements in the same direction. These shifts transform the original circuit to a modified linear finite state machine circuit that is capable of providing the same output sequence as the original circuit, but with fewer levels of logic and a lower internal fan-out.

In another aspect of the invention, a method for synthesizing a linear finite state machine includes the following steps. An original linear finite state machine circuit is obtained, the circuit including a plurality of memory elements and linear logic gates and capable of generating an output sequence. At least first and second feedback connections in the original circuit are determined, each feedback connection spanning a number of memory elements and including a source tap and destination tap connected by an associated feedback connection line, the destination tap including a destination linear logic gate. The source and destination taps of the feedback connections are then shifted relative to one another such that the destination tap of the first feedback and the source tap of the second feedback connection cross. Another feedback connection line is then added between a source tap of the first feedback connection and a destination linear logic gate at a destination tap of the second feedback connection. These shifts and additional feedback line transform the original circuit to a modified linear finite state machine circuit that is capable of providing the same output sequence as the original circuit.

In another aspect of the invention, a linear finite state machine circuit comprises a plurality of memory elements and linear logic gates, wherein fan-out within the circuit is no greater than two and the number of level of linear logic within the circuit is no greater than one.

These and other aspects of the invention are described in further detail below, which description refers to the following drawings.

DETAILED DESCRIPTION

In the exemplary embodiments shown and described herein, methods for synthesizing LFSMs in accordance with the invention are implemented in software stored on a computer-readable medium and executed on a general-purpose computer system. Such a computer system is represented by block 18 in FIG. 3. The invention, for example, can be implemented in computer aided-design tools that explore the domain of possible solutions and different trade-offs concerning the layout of LFSRs. For clarity, only those aspects of the software germane to the invention are described; product details well known in the art are omitted. For the same reason, the computer hardware is not described in further detail. It should appreciated that the invention is not limited to use with computer system 18 or any particular computer language or program.

Figure 1:
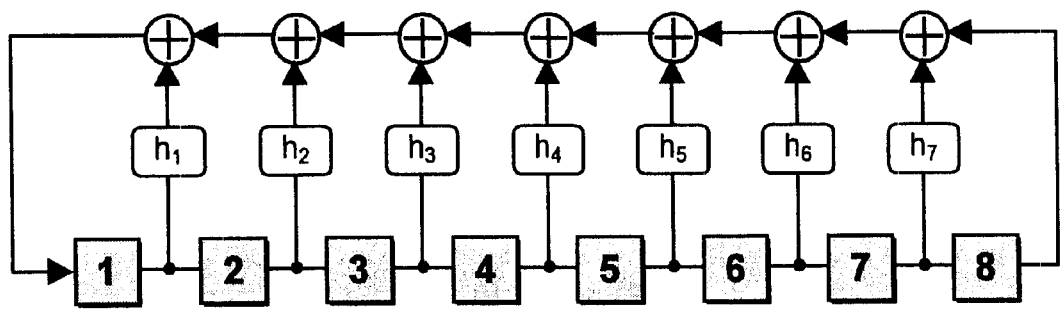
FIG. 1 is a diagram of a type I LFSR.
Figure 2:
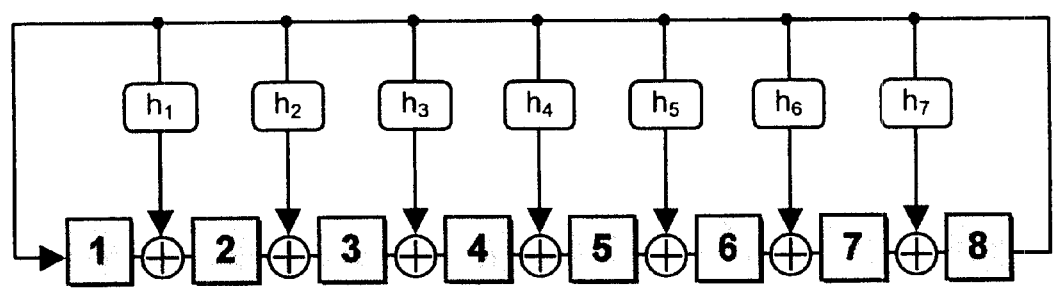
FIG. 2 is a diagram of a type II LFSR.

FIG. 2 shows an LFSM in the form of an arbitrary maximum-length type II LFSR with n memory elements such as flip-flops or latches and a number of feedback connections. Each feedback connection includes a source tap corresponding to an output of a memory element feeding this particular connection, a feedback connection line spanning a number of memory elements as defined by the primitive characteristic polynomial employed, and a linear gate such as an XOR gate placed at a destination tap of the feedback connection, that is, at the input to another memory element. In accordance with the synthesis method to be described, the LFSR architecture can be transformed by shifting its feedback connections across memory elements for the purpose of performance optimization and to minimize the total length of the feedback lines. These transformations may be carried out in such a way that they preserve the m-sequence of the original LFSR circuit, although the modified LFSR circuit may feature a different state trajectory than that of the original circuit. That is, the LFSR state trajectories (the contents of the memory elements at any given time) may differ between the original and modified circuits although the m-sequence, taken from an output of each circuit, is preserved. If the same LFSR seed is used in both circuits, then the m-sequence is the same when taken from different memory elements. If different LFSR seeds are available, then the m-sequence may be the same when taken from the same memory element.

Figure 3:
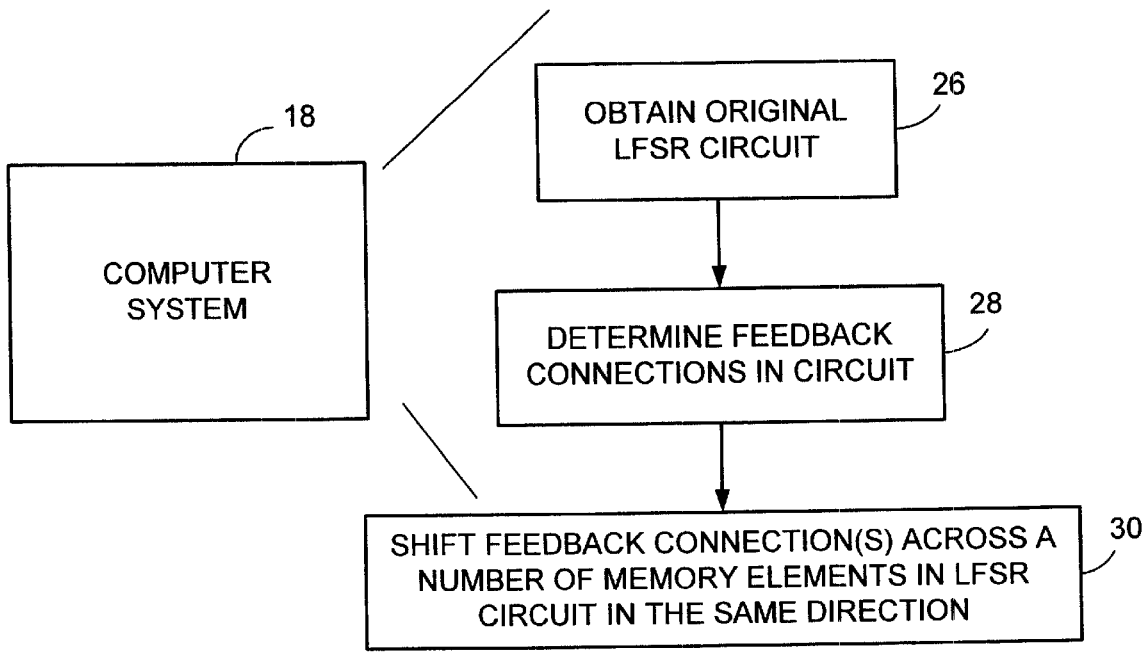
FIG. 3 is a flowchart of a first synthesis method in accordance with the invention.
Figure 4A:
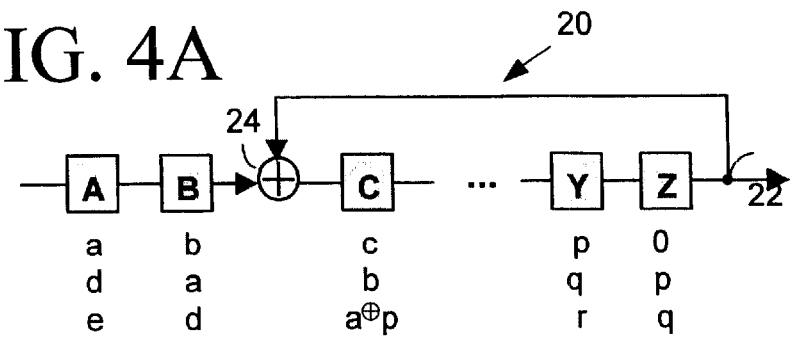
FIGS. 4A and B illustrate an EL transformation of an LFSR in accordance with the method.
Figure 4B:
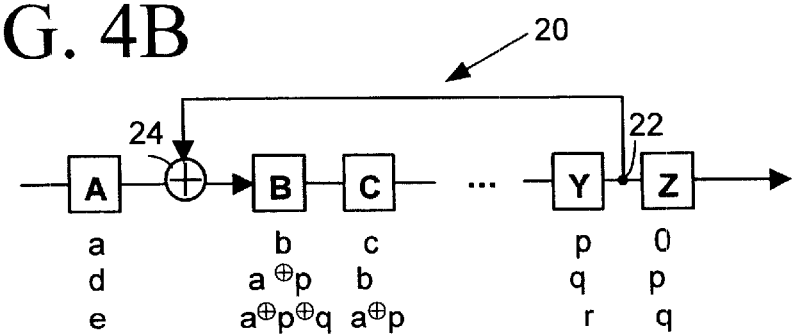

FIG. 3 is a flowchart of a first synthesis method, and FIGS. 4A and B illustrate an application of the method to an LFSR transformation called an elementary shift to the left, or EL. FIG. 4A shows the original LFSR circuit with a feedback connection 20 spanning a number of memory elements and including a source tap 22 at the output of memory element Z and a destination tap (including a destination XOR gate 24) at the input to memory element C. The taps are connected by an associated feedback connection line. FIG. 4B shows the modified LFSR circuit resulting from the transformation. In FIG. 4A, all memory elements but the rightmost one (Z) are assumed to contain initially symbols a, b, c, . . . , p. The memory element Z should initialized to 0 (or initialized to 1 if an XNOR gate is used in place of the XOR gate). After one shift (FIG. 4A), the memory elements contain symbols d, a, b, . . . , q, p, as a new symbol d enters the memory element A. After the next shift, the contents of the memory elements are as follows: e, d, a⊕p, . . . , r, q. Further operation of the LFSR produces additional shifts of data as shown. Now, in FIG. 4B, a transformation EL is applied to the original LFSR circuit, and it places the XOR gate 24 at the input of the memory element B and relocates the source tap 22 of the feedback connection 20 to the output of memory element Y, accordingly. Assuming the same initial state as before (in particular the value of 0 is loaded into memory element Z) it can be observed that the contents of the memory elements spanned by the original feedback line, that is, flip-flops C, . . . , Y, Z, match the symbols appearing at the outputs of flip-flops C, . . . , Y, Z in the original circuit. Consequently, m-sequences produced on the outputs of these memory elements are preserved and the transformed LFSR remains a maximum-length circuit. It can be noticed, however, that its state trajectory may differ from the original one as memory element B receives different symbols in both cases. In a similar manner, a transformation ER (elementary shift to the right) can be applied to the LFSR. Assuming that flip-flop Z is initially reset, all m-sequences produced on bits spanned by the feedback connection after the transformation will be preserved.

The actions carried out by the above LFSR transformations are described more generally in FIG. 3 with reference to the computer system 18. A copy of the original LFSR circuit is obtained by synthesis software or an equivalent tool (26), typically from secondary storage or from memory if entered directly by a user. The feedback connections in the original circuit are then determined (28), such as the feedback connection spanning memory elements C through Z in the LFSR circuit of FIG. 4A. One or more of the feedback connection may then shifted across a number of memory elements in the original circuit in the same direction (30). These shifts are carried out to reduce the length of feedback lines, to reduce the levels of linear logic, and to reduce the internal fan-out of the original circuit.

Figure 5:
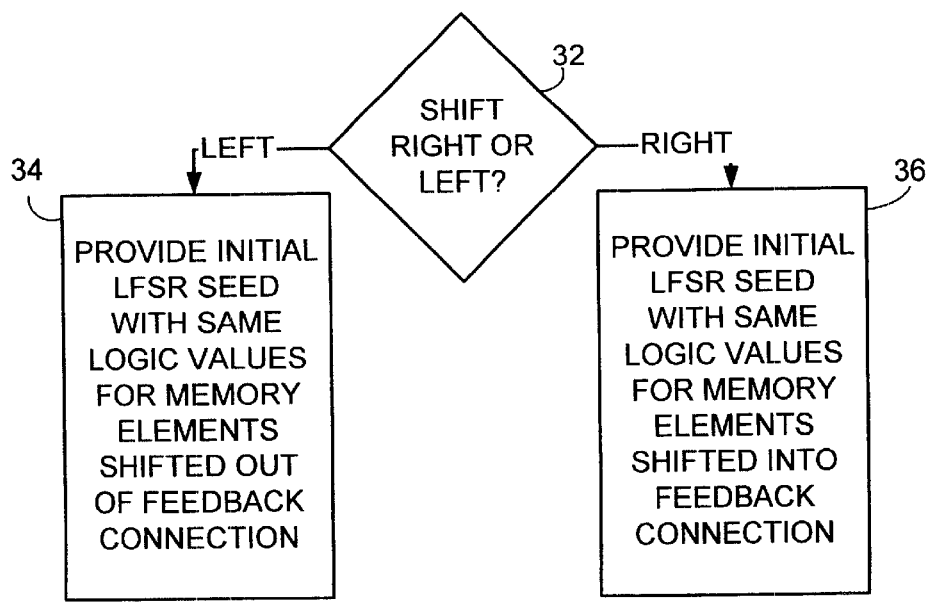
FIG. 5 is a flowchart of a method for initializing LFSRs in accordance with the invention.

FIG. 5 is a flowchart that illustrates how, by selecting an appropriate seed, the m-sequence can be preserved in the modified LFSR circuit despite the shifting of feedback connections across memory elements. The direction of shift is determined (32)—left (defined as upstream, against the direction of data flow through the memory elements) or right (defined as downstream, with the direction of data flow through the memory elements). Where a shift is to the left in the LFSR (34), then the initial LFSR vector, or seed, is provided with the same logic values for memory elements being shifted out of the feedback connection as a result of the shift. Where a shift is to the right in the LFSR (36), then the initial LFSR vector, or seed, is provided with the same logic values for memory elements being shifted into the feedback connection as a result of the shift. In either case, the same logic values are zero if the linear gates of the original circuit are XOR gates and the same logic values are one if the linear gates of the original circuit are XNOR gates.

Figure 6A:
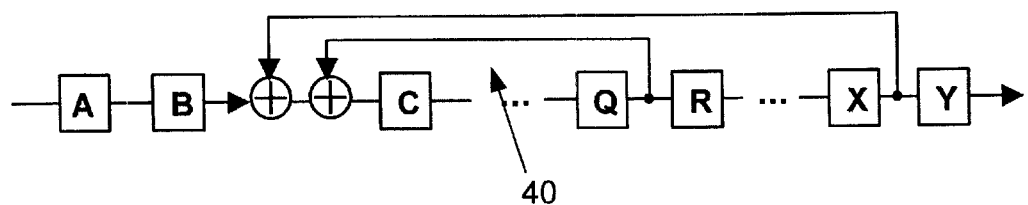
FIGS. 6A and B illustrate application of an elementary shift to the left (EL) transformation that causes two linear logic gates in an LFSR to cross.
Figure 6B:
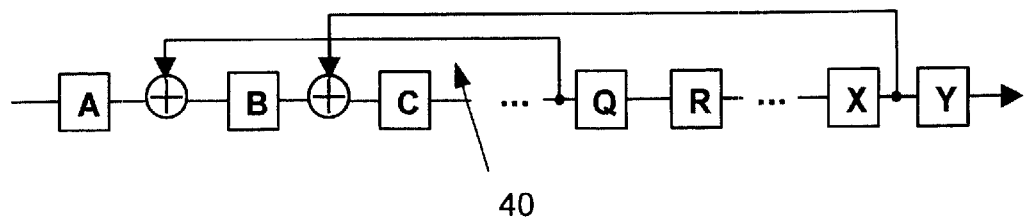
Figure 7A:
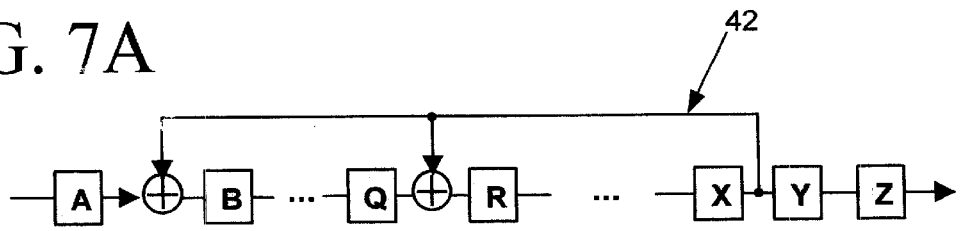
FIGS. 7A and B illustrate application of an E elementary shift to the right (E) transformation that causes two source taps in an LFSR to cross.
Figure 7B:
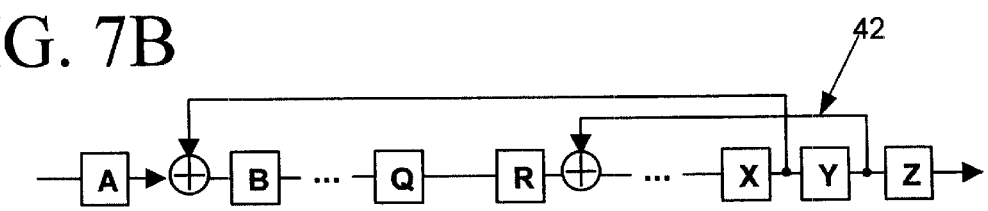

Transformations EL and ER can be extended to handle cases in which a destination gate (or a source tap) of a feedback connection being moved crosses another destination gate (or source tap), respectively. Examples of these situations are illustrated in FIGS. 6A and B and 7A and B. As can be seen, the internal (shorter) feedback connections 40 and 42 in FIGS. 6A and 7A, respectively, can be shifted to the left or to the right in FIGS. 6B and 7B, respectively, and no further transformations are required. Indeed, the shifted feedback connection provides symbols to memory elements whose contents remain unaffected by transformations EL or ER. This form of the transformations thus preserves the maximum-length property of the circuit, provided that all memory elements are initialized with an appropriate seed as described above. In particular, flip-flop Q in FIGS. 6A and B and flip-flop Y in FIGS. 7A and B should be initialized to 0 when performing transformations EL and ER, respectively.

Figure 8:
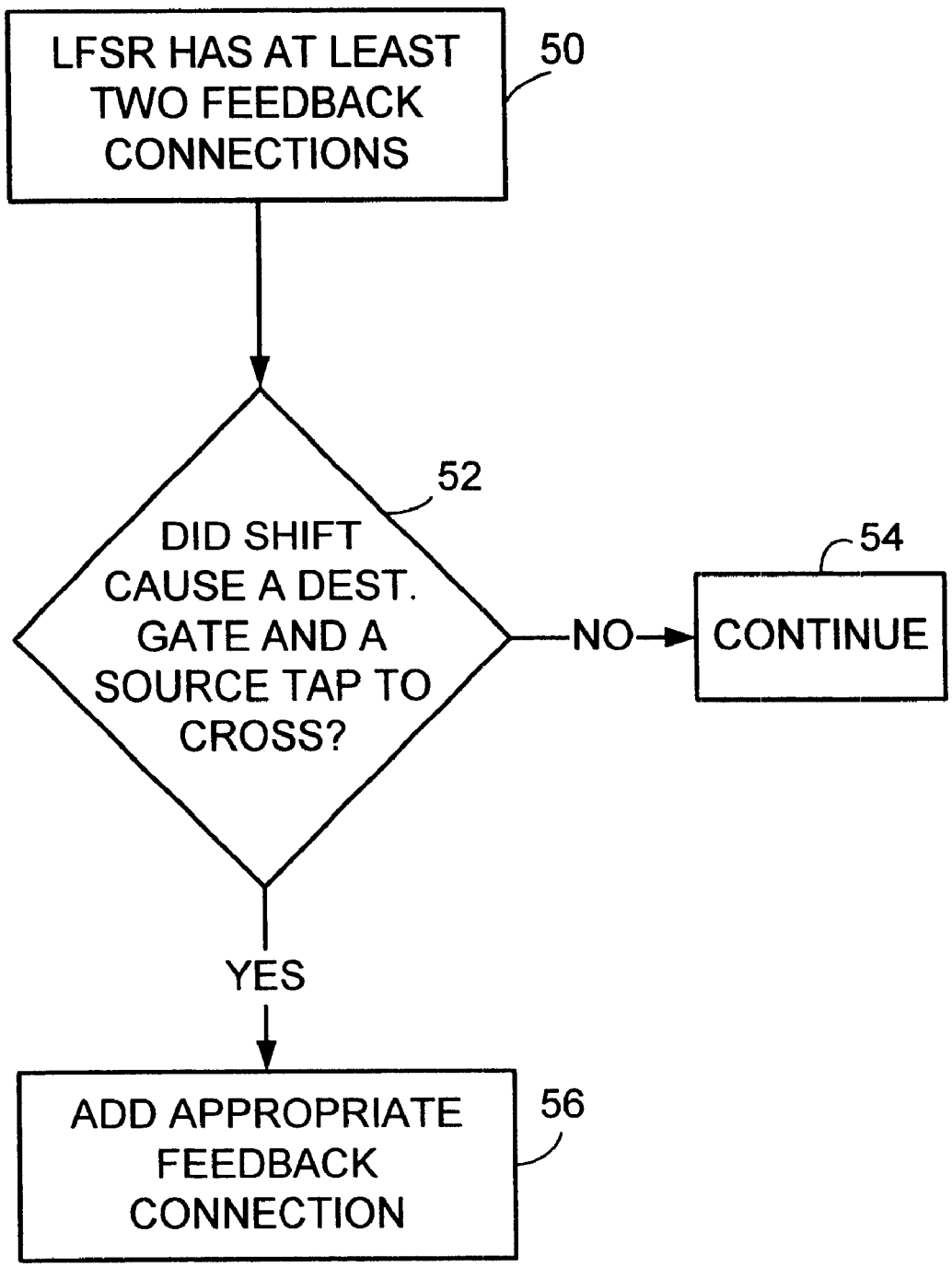
FIG. 8 is a flowchart of a second synthesis method in accordance with the invention.

FIG. 8 is a flowchart that illustrates a second synthesis method wherein a feedback connection shift causes the destination gate in one feedback connection and the source tap in another feedback connection to cross. The method can be used if the original LFSR circuit has at least two feedback connections (50). The circuit topology is checked after a shift to determine if a destination gate and a source tap have crossed (52). If not, the first method continues to its conclusion (54). However, if a destination gate and source tap cross, an appropriate feedback connection is added to the LFSR circuit (56) as described below. Because a feedback connection can be moved either to the right or to the left, there are four corresponding transformations that can result from such a crossing: SDL (a source tap crosses a destination gate while moving to the left); SDR (a source tap crosses a destination gate while moving to the right); DSL (a destination gate crosses a source tap while moving to the left); and DSR (a destination gate crosses a source tap while moving to the right).

Figure 9A:
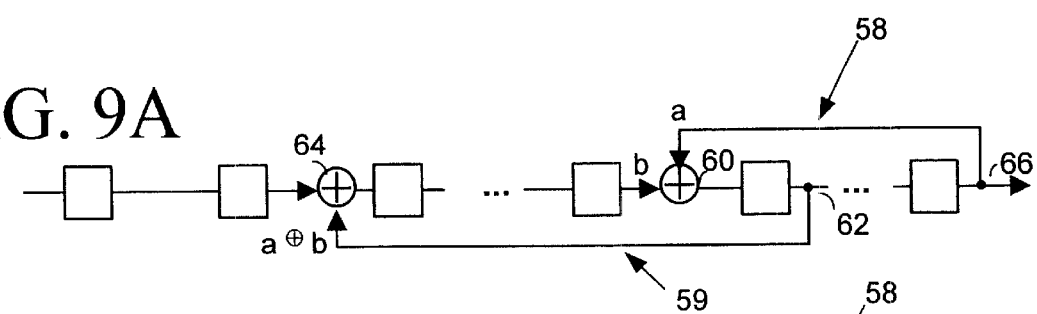
FIGS. 9A–C illustrate application of a source tap crossing a destination tap while moving to the left (SDL) transformation in accordance with the second method.
Figure 9B:
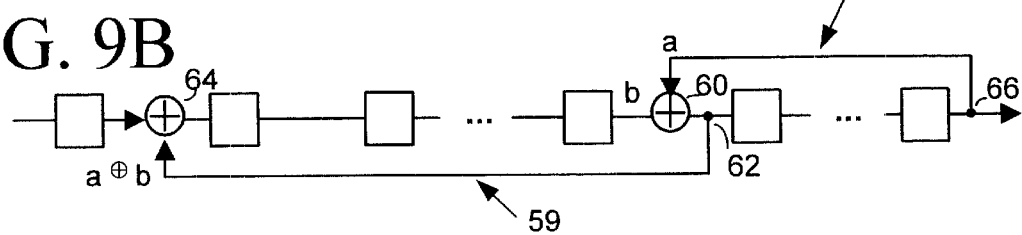
Figure 9C:
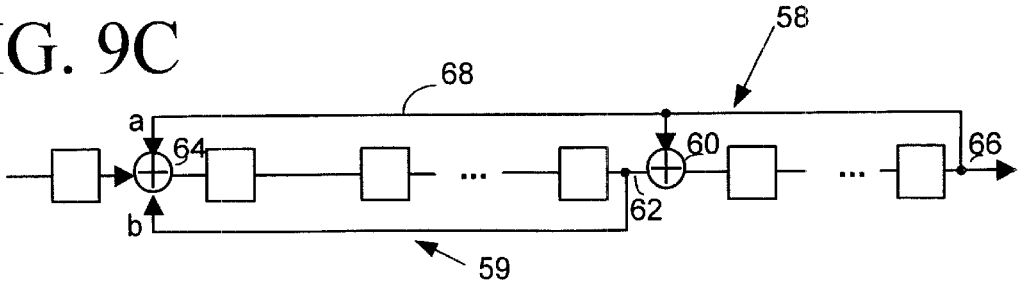

Transformation SDL is illustrated in FIGS. 9A–C. It can be used when two feedback connections 58 and 59 are arranged in such a way that a linear gate 60 (such as the XOR gate shown) at the destination tap of the first feedback connection is separated from a source tap 62 of the second feedback connection by a single memory element, as shown in FIG. 9A. During the first part of the transformation, the source tap 62 shifts across this memory element (FIG. 9B). The XOR gate 64 at the destination tap of the second feedback connection also shifts to the left accordingly. This operation preserves the maximum-length property of the LFSR since this act is equivalent to transformation EL described earlier. Subsequently, however, the source tap 62 moves further and crosses the XOR gate 60 of the first feedback connection 58 (FIG. 9C). Symbols carried by the second feedback connection 59 are now no longer equivalent to a⊕b; instead, they are now equal to just b. To maintain the same functionality on the output of the destination XOR gate 64, symbol a must be provided by the source tap 66 of the first feedback connection 58 to the XOR gate 64. This is accomplished by adding a feedback connection line 68 between the source tap 66 and the XOR gate 64 at the shifted destination tap. It is worth noting that symbol a can represent several feedback paths reaching their destination at this particular gate. In such a case, all of these feedback connections should be extended as required by transformation SDL. The same rule applies to transformations SDR, DSL, and DSR.

Figure 10A:
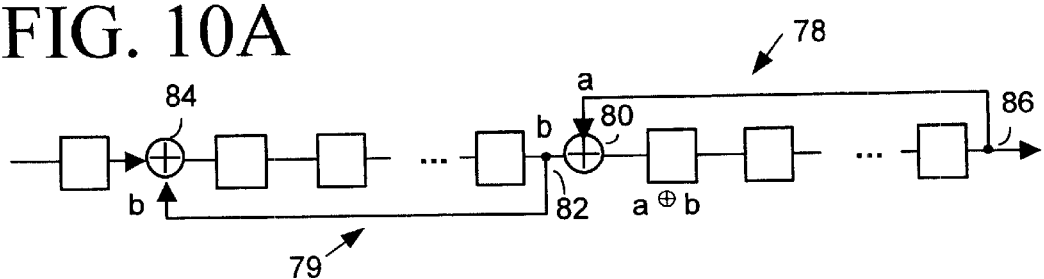
FIGS. 10A–C illustrate application of a source tap crossing a destination tap while moving to the right (SDR) transformation in accordance with the second method.
Figure 10B:
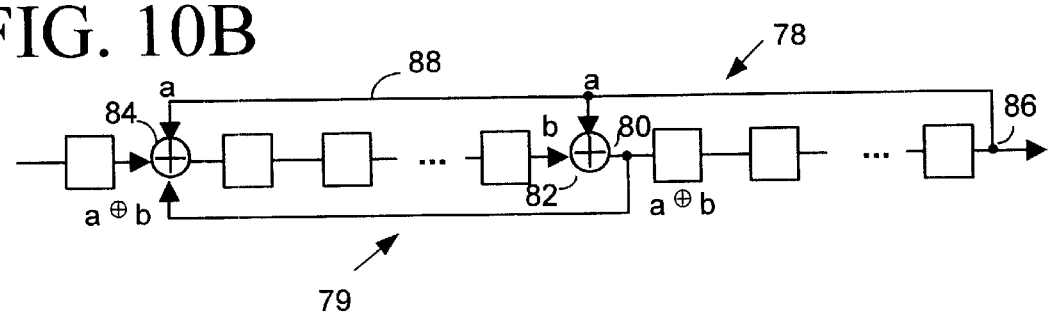
Figure 10C:
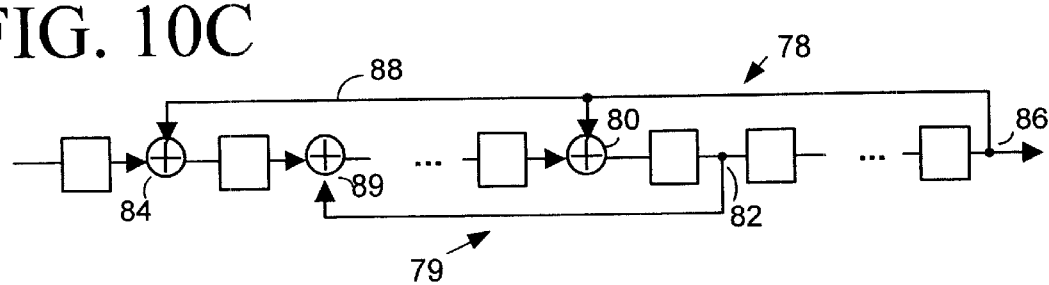

Transformation SDR is shown in FIGS. 10A–C. Initially, both feedback connections 78 and 79 involved in this operation do not span any common memory elements (FIG. 10A). In fact, the second feedback connection 79, to be shifted to the right, has its source tap 82 at the output of the flip-flop feeding the XOR gate 80 at the destination tap of the first feedback connection 78. Therefore, the output of the gate 80 is equal to a⊕b. During the first action, the source tap 82 crosses the XOR gate 80, thus changing finctionality of the circuit (FIG. 10B). To restore the former value on the output of the XOR gate 84 at the destination tap of the second feedback connection 79, a feedback connection line 88 is added between the XOR gate 84 and the source tap 86 of the first feedback connection 78. The added feedback line 88 compensates for the presence of symbol a by taking advantage of the equation a⊕b⊕a=b. Finally, an ER transformation may be carried out on the second feedback connection 79 with no effect on the function of the LFSR, the transformation adding an additional XOR gate 89 (FIG. 10C).

Figure 11A:
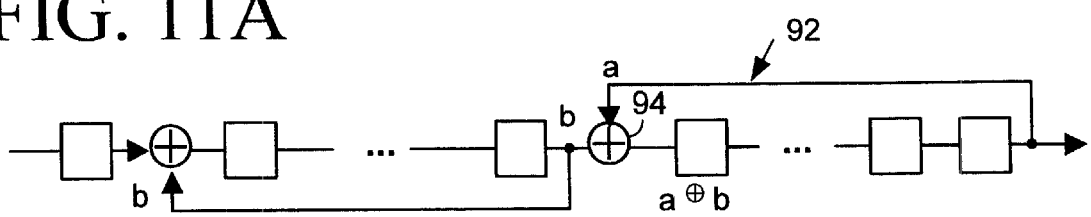
FIGS. 11A–C illustrate application of a destination tap crossing a source tap while moving to the left (DSL) transformation in accordance with the second method.
Figure 11B:
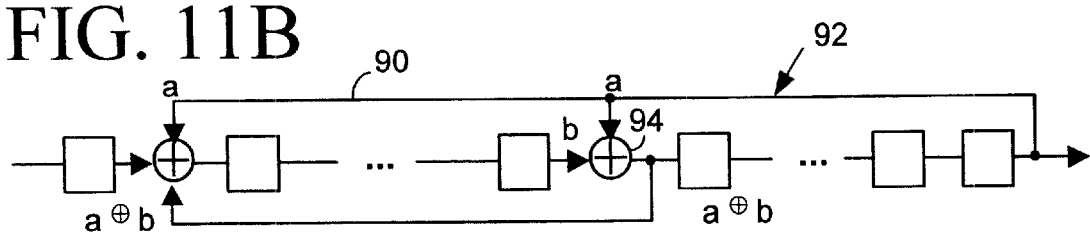
Figure 11C:
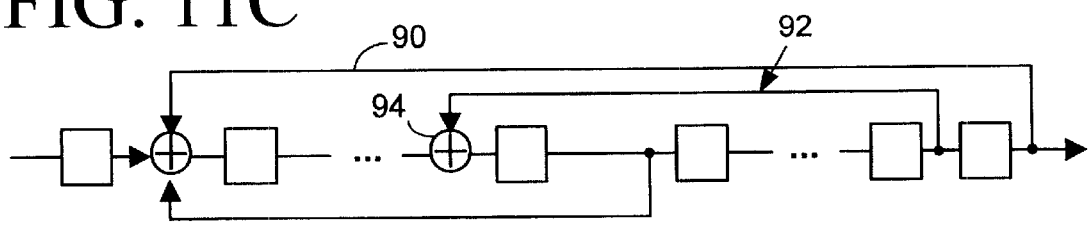

Transformation DSL is shown in FIGS. 11A–C. The initial setup (FIG. 11A) as well as the first acts are similar to those of transformation SDR. Consequently, a new feedback connection line 90 is added to restore an original functionality of the circuit (FIG. 11B). During the last act (FIG. 11C), however, a transformation EL is performed on the first feedback connection 92, leading to a structure with XOR gate 94 of the first feedback connection shifted by one memory element to the left.

Figure 12A:
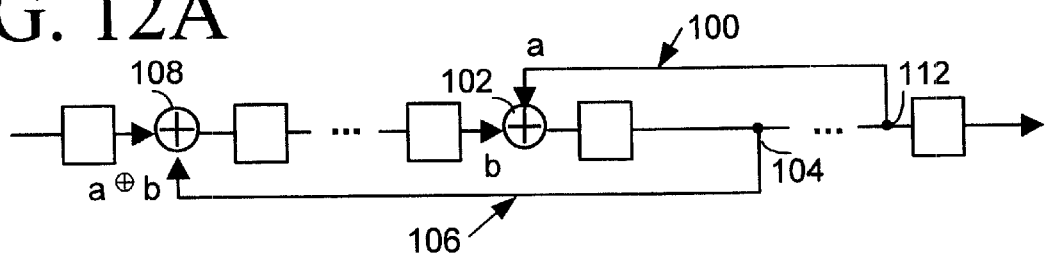
FIGS. 12A–C illustrate application of a destination tap crossing a source tap while moving to the right (DSR) transformation in accordance with the second method.
Figure 12B:
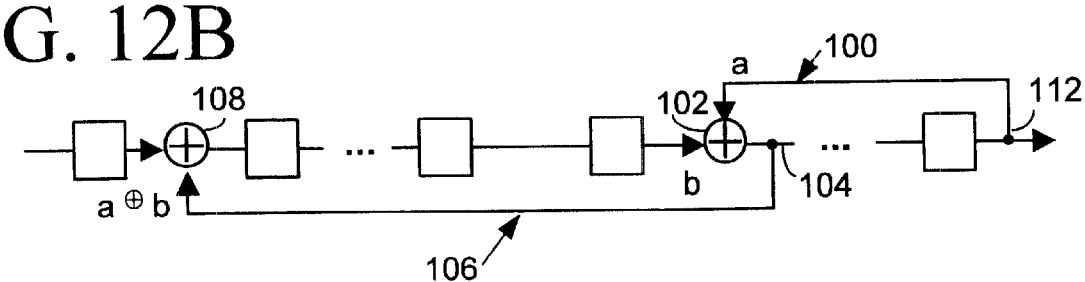
Figure 12C:
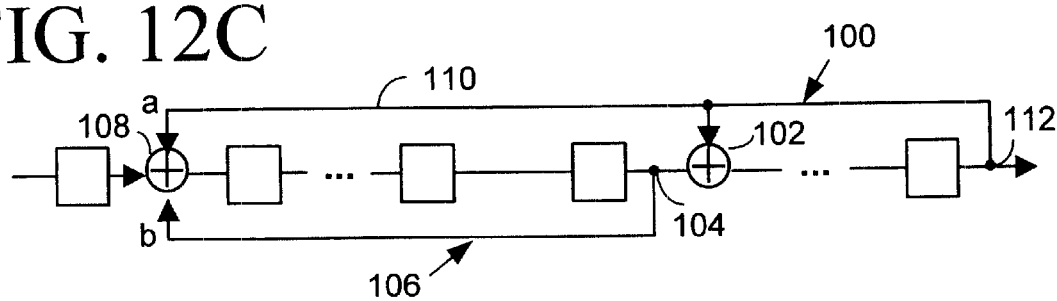

Transformation DSR is shown in FIGS. 12A–C. In forming a modified LFSR circuit from the original circuit, transformation ER is first applied to the first feedback connection 100 (FIG. 12B). Subsequently, the XOR gate 102 of the first feedback connection is shifted such that it crosses the source tap 104 of the second feedback connection 106, or equivalently, the source tap 104 is moved from the output of the XOR gate 102 to the gate's input (FIG. 12c). This last act removes symbol b from the sum a⊕b being provided to the XOR gate 108 of the second feedback connection. Its loss must be compensated for by adding a feedback connection line 110 between the source tap 112 of the first feedback connection 100 and the XOR gate 108 to maintain both arguments, a and b, on the gate's inputs (FIG. 9C).

The transformations described (EL, ER, SDL, SDR, DSL, DSR) can be utilized one or more times in synthesizing a LFSM. They can also be combined with other transformations in a synthesis. Examples of these possible applications are described below. The architecture of the modified linear finite state machine that can be obtained from these transformations is characterized by an internal fan-out no greater than two, no more than one level of linear logic gates, and short feedback connection lines.

Figure 13A:
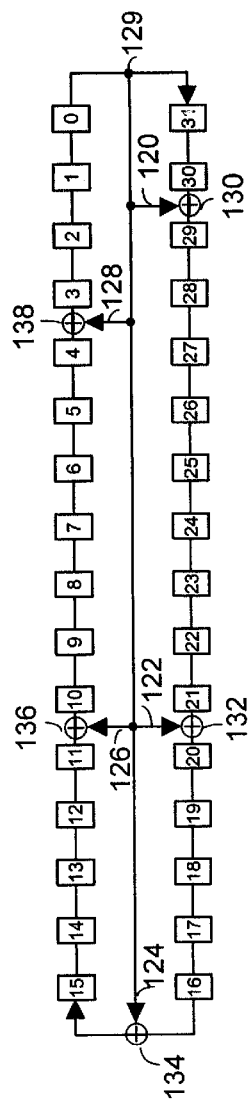
FIGS. 13A–D are examples of synthesizing an LFSR from three types of LFSMs: a type I LFSR, a type II LFSR, and a linear cellular automaton.
Figure 13B:
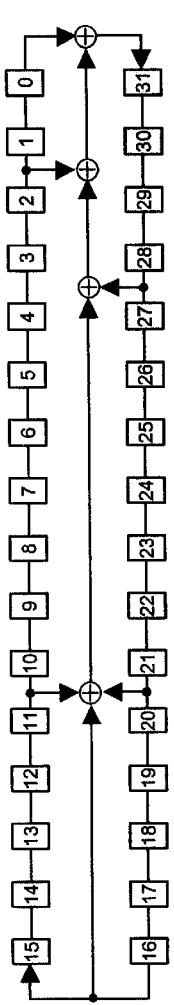
Figure 13C:
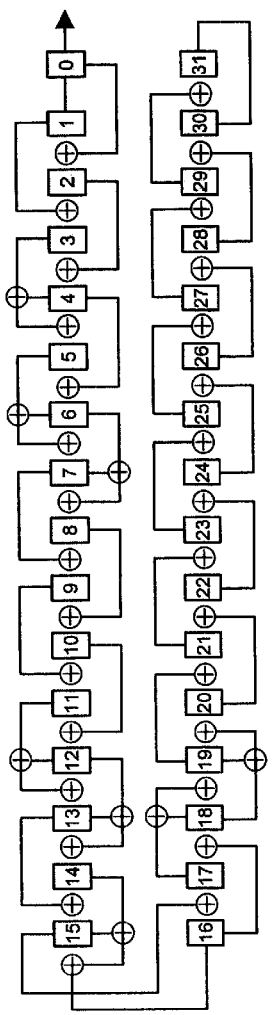
Figure 13D:
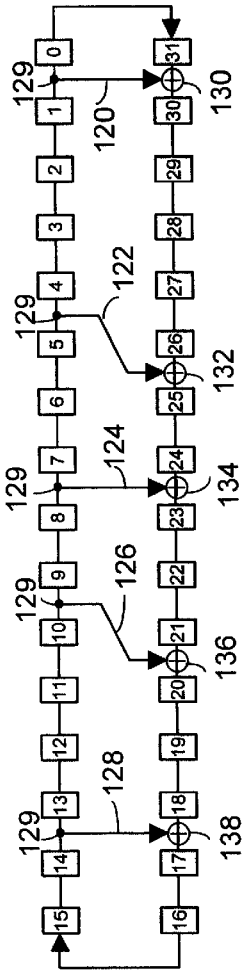

FIGS. 13A–D are examples of synthesizing an LFSR from various types of LFSMs, including a type I LFSR, a type II LFSR, and a linear cellular automaton, by successive applications of EL transformations. In particular the structure of the LFSR shown in FIG. 13A is a true Galois divisor or type II shift register implementing primitive characteristic polynomial $x^{32}+x^{30}+x^{21}+x^{16}+x^{11}+x^4+1$, with five feedback connections that includes lines 120–128 each connecting a shared source tap 129 to separate destination taps that include XOR gates 130–138, respectively. In this LFSR, the XOR gates are each disposed in a respective forward transmission path along the chain of memory elements. Thus, for instance, each XOR gate has one input coupled to the output of a preceding stage, its output coupled to the input of the succeeding stage, and a second input connected to the feedback path line originating at the output of memory element 0. The overall layout of the LFSR circuit has been optimized prior to any further transformations by forming a ring structure. Nevertheless, two of the most significant benefits of the present synthesis methods appear in FIG. 13D, which illustrates a transformation of the original type II LFSR circuit of FIG. 13A to a modified LFSR circuit. As can be seen, the modified LFSR of FIG. 13D has been obtained by applying the transformation EL to the five feedback connections (represented by coefficients $x^{30}$, $x^{21}$, $x^{16}$, $x^{11}$, and $x^4$) one, five, eight, ten, and fourteen times, respectively. This results in movement and division of the source tap 129 into five separate taps and movement of the XOR gates 130–138. Consequently, the combined total length of feedback lines 120–128 in the modified LFSR circuit has been drastically reduced from that of the original LFSR circuit. The internal fan-out of the LFSR has also been reduced by a factor of three, from six elements (memory element 31 and the five XOR gates 130–138) fed by flip-flop 0 in the original LFSR circuit to only two elements (the next memory element and one XOR gate) fed by any flip-flop in the modified LFSR circuit. Furthermore, the modified LFSR circuit of FIG. 13D has, in its worst case, only one level of XOR logic between any pair of flip-flops.

An LFSR can also be synthesized from other types of LFSMs. For example, the modified LFSR shown of FIG. 13D can be obtained from the type I LFSR of FIG. 13A (implementing the same primitive characteristic polynomial $x^{32}+x^{30}+x^{21}+x^{16}+x^{11}+x^4+1$) by applying the transformations described above. Furthermore, the modified LFSR of FIG. 13D can be obtained from the 32-bit linear cellular automaton of FIG. 13C (implementing also the same primitive characteristic polynomial $x^{32}+x^{30}+x^{21}+x^{16}+x^{11}+x^4+1$) by applying these transformations with null boundary conditions shown in the figure.

Figure 14A:
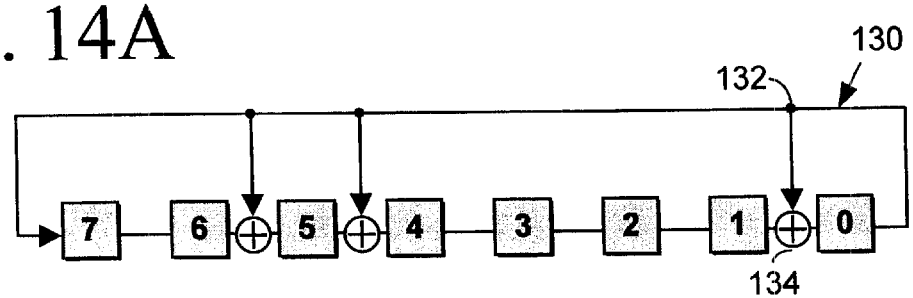
FIGS. 14A–D are an example of synthesizing an LFSR by applying a combination of different transformations to an original LFSR circuit.
Figure 14B:
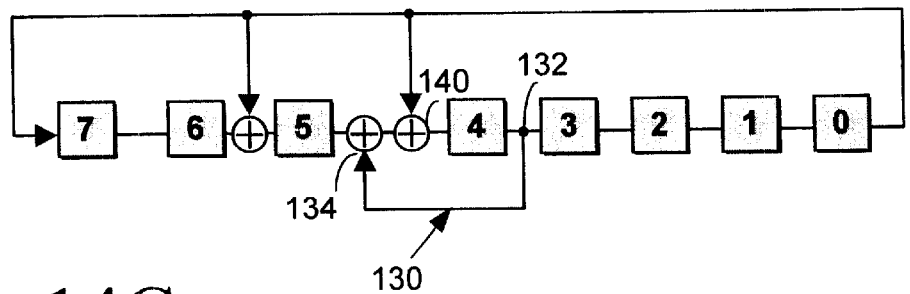
Figure 14C:
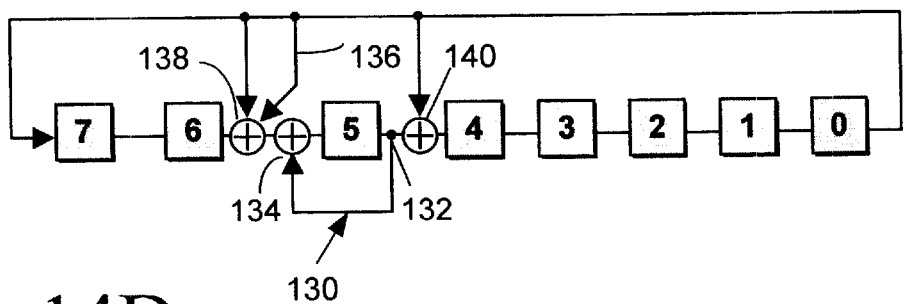
Figure 14D:
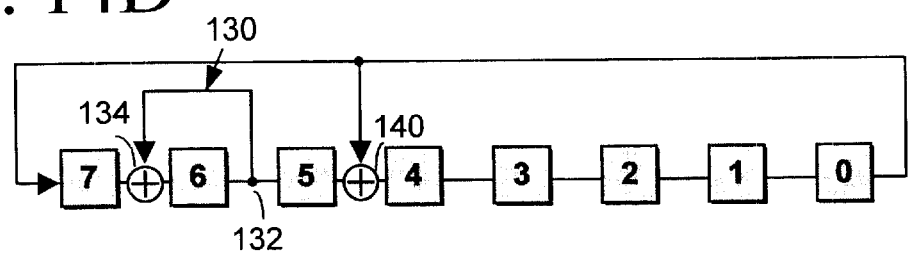

FIGS. 14A–D are an example of synthesizing an LFSR by applications of a combination of the above transformations, in this case EL transformations and an SDL transformation. FIG. 14A depicts a type II LFSR implementing primitive characteristic polynomial $x^8+x^6+x^5+x+1$. Applying the transformation EL four times to the feedback connection represented by coefficient x (feedback connection 130 with source tap 132 and destination gate 134) leads to the circuit shown in FIG. 14B. Applying transformation SDL then shifts feedback connection 130 further to the left by one memory element and adds a feedback connection line 136 at the input to the XOR gate 134 (FIG. 14C). However, because another XOR gate 138 with the same connectivity already exists on the output flip-flop 6, the gate 134 and connection 136 can be discarded. This reduces the number of XOR gates in the LFSR from three to two. To reduce the load of flip-flop 5 (driving XOR gates 140 and 138 in FIG. 14C), an additional transformation EL can be applied in FIG. 14D that shifts the feedback connection 130 further to the left.

Having illustrated and described the principles of the invention in exemplary embodiments, it should be apparent to those skilled in the art that the illustrative embodiments can be modified in arrangement and detail without departing from such principles. For example, the invention may be practiced without the assistance of a computer if desired, so long as its application produces a useful, concrete, and tangible result. The invention can be used for synthesizing LFSMs other than LFSRs and cellular automata. In view of the many possible embodiments to which the principles of the invention may be applied, it should be understood that the illustrative embodiments are intended to teach these principles and not to limit the scope of the invention. We therefore claim as our invention all that comes within the scope and spirit of the following claims and their equivalents.

We claim:

1. A method to create a linear finite state machine, comprising:

providing a first linear finite state machine including multiple memory elements coupled in series, wherein at least a portion of the memory elements have linear logic elements coupled therebetween and wherein at least a portion of the memory elements provide feedback to the linear logic elements; and transforming the first linear finite state machine to a second linear finite state machine having a different circuit structure, but which provides the same output sequence as the first linear finite state machine, wherein the second linear finite state machine has a fan-out no greater than two and a number of linear logic elements between the memory elements that is no greater than one.

2. The method of claim 1, wherein the second linear finite state machine is a type I LFSR.

3. The method of claim 1, wherein the second linear finite state machine is a type II LFSR.

4. The method of claim 1, wherein the second linear finite state machine is a cellular automation.

5. The method of claim 1, wherein transforming includes shifting at least one of the feedback connections between different memory elements.

6. The method of claim 1, wherein the feedback includes a feedback connection line having source and destination taps and wherein transforming includes shifting the source and destination taps across a number of memory elements.

7. The method of claim 6, wherein the source tap and destination tap of the feedback connection are shifted across a same number of memory elements.

8. The method of claim 6, wherein shifting the taps of a feedback connection includes reducing the length of the associated feedback connection line.

9. The method of claim 6, wherein shifting the taps of a feedback connection includes reducing the levels of linear logic gates in the original circuit.

10. The method of claim 6, wherein shifting the taps of a feedback connection includes reducing the internal fan-out of the original circuit.

11. The method of claim 1, wherein the original circuit is a maximum-length linear feedback shift register producing a maximum-length output sequence, and the modified circuit is capable of providing the same maximum length sequence as the original circuit.

12. The method of claim 1, wherein the linear logic elements include XOR or XNOR gates.

13. The method of claim 1, wherein the memory elements include flip-flops.

14. A method to synthesize a linear finite state machine, comprising:

transforming a first linear finite state machine to a different, second linear finite state machine, which provides the same output sequence as the first linear finite state machine, wherein the second linear finite state machine has a fan-out no greater than two and a number of linear logic elements between memory elements that is no greater than one.

15. The method of claim 14, wherein the first linear finite state machine includes multiple memory elements coupled in series, wherein at least a portion of the memory elements have linear logic elements coupled therebetween and wherein at least a portion of the memory elements provide feedback to the linear logic elements.

16. The method of claim 14, wherein the second linear finite state machine is a type I LFSR.

17. The method of claim 14, wherein the second linear finite state machine is a type II LFSR.

18. The method of claim 14, wherein the second linear finite state machine is a cellular automation.

* * * * *